United States Patent
Choi et al.

(10) Patent No.: US 9,012,319 B1
(45) Date of Patent: Apr. 21, 2015

(54) METHODS OF FORMING GATE STRUCTURES WITH MULTIPLE WORK FUNCTIONS AND THE RESULTING PRODUCTS

(71) Applicant: GLOBALFOUNDRIES Inc., Grand Cayman (KY)

(72) Inventors: Kisik Choi, Hopewell Junction, NY (US); Hoon Kim, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/069,782

(22) Filed: Nov. 1, 2013

(51) Int. Cl.
*H01L 21/3205* (2006.01)
*H01L 21/28* (2006.01)
*H01L 29/51* (2006.01)

(52) U.S. Cl.
CPC ........ *H01L 21/28158* (2013.01); *H01L 29/512* (2013.01); *H01L 29/517* (2013.01)

(58) Field of Classification Search
CPC .............. H01L 27/092; H01L 27/0928; H01L 27/0922; H01L 21/823842; H01L 21/823857; H01L 21/283
USPC .......................................... 438/590, 591, 585
See application file for complete search history.

(56) References Cited

U.S. PATENT DOCUMENTS

| | | | |
|---|---|---|---|
| 7,332,433 B2 | 2/2008 | Choi et al. | |
| 7,858,459 B2 * | 12/2010 | Ramin et al. | ................... 438/197 |
| 8,236,686 B2 | 8/2012 | Lee et al. | |
| 2009/0039441 A1 | 2/2009 | Luna et al. | |
| 2009/0108294 A1 | 4/2009 | Choi et al. | |
| 2011/0309455 A1 | 12/2011 | Ando et al. | |
| 2012/0256270 A1 | 10/2012 | Lee et al. | |
| 2012/0261761 A1 * | 10/2012 | Wang et al. | ................... 257/368 |
| 2012/0299123 A1 | 11/2012 | Ando et al. | |
| 2014/0183653 A1 * | 7/2014 | Niimi et al. | ................... 257/369 |

\* cited by examiner

*Primary Examiner* — Yu-Hsi D Sun
*Assistant Examiner* — Christina Sylvia
(74) *Attorney, Agent, or Firm* — Amerson Law Firm, PLLC

(57) ABSTRACT

One illustrative method disclosed herein includes removing sacrificial gate structures for NMOS and PMOS transistors to thereby define NMOS and PMOS gate cavities, forming a high-k gate insulation layer in the NMOS and PMOS gate cavities, forming a lanthanide-based material layer on the high-k gate insulation layer in the NMOS and PMOS gate cavities, performing a heating process to drive material from the lanthanide-based material layer into the high-k gate insulation layer so as to thereby form a lanthanide-containing high-k gate insulation layer in each of the NMOS and PMOS gate cavities, and forming gate electrode structures above the lanthanide-containing high-k gate insulation layer in the NMOS and PMOS gate cavities.

19 Claims, 13 Drawing Sheets

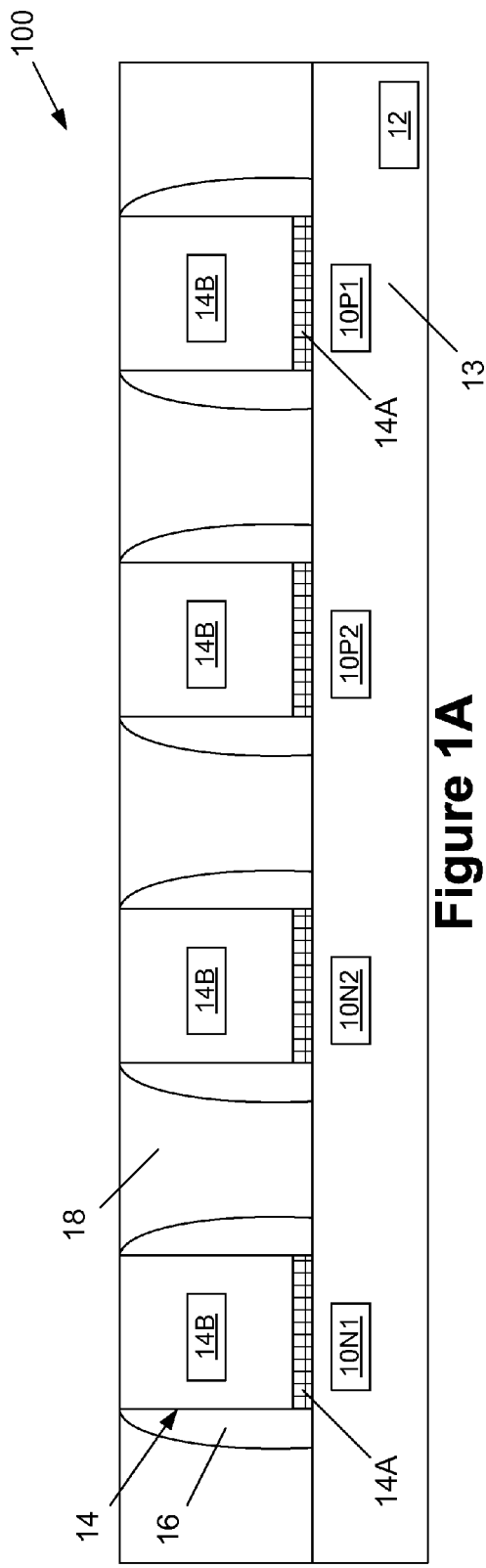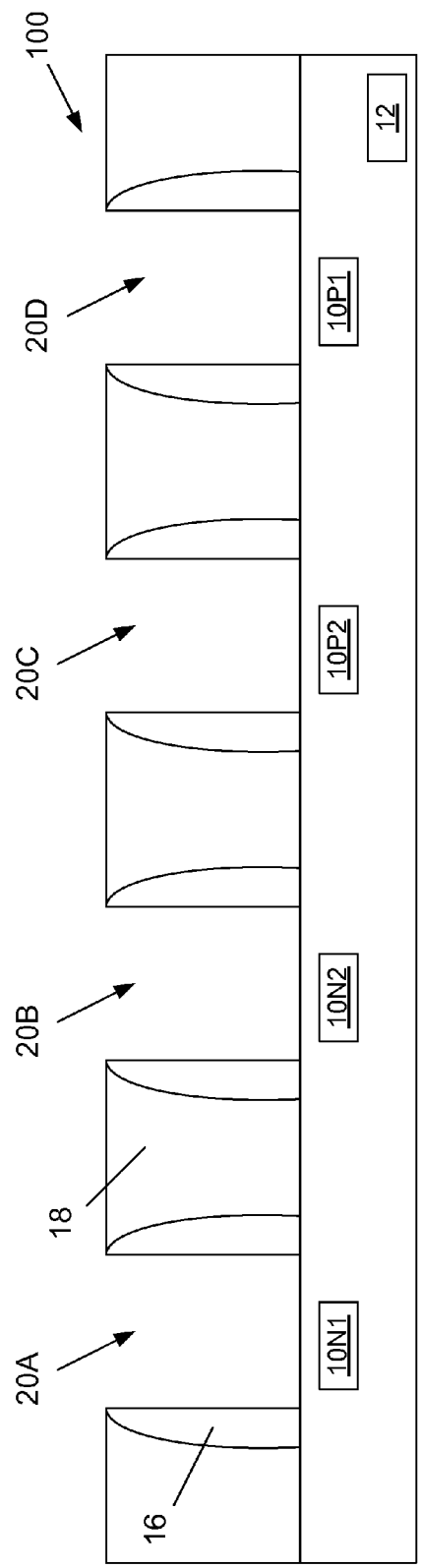

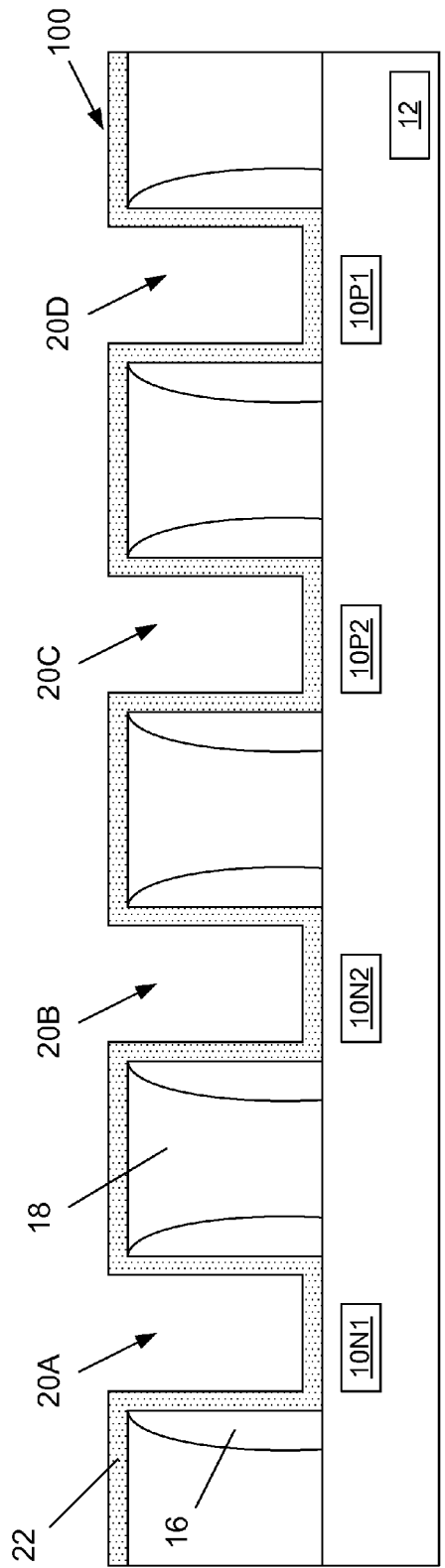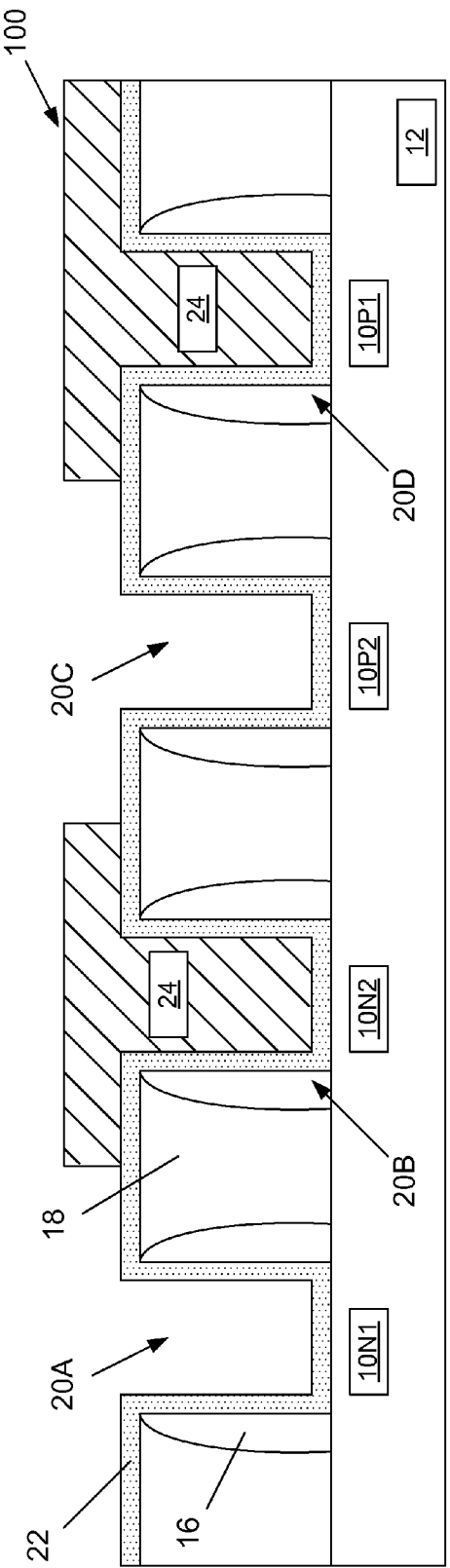

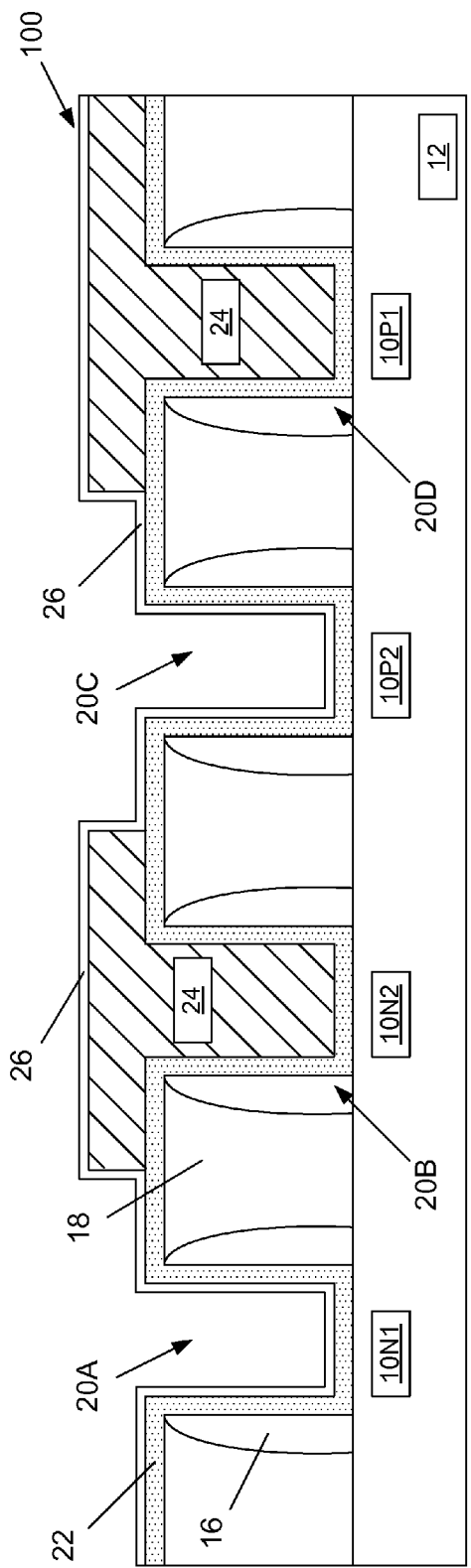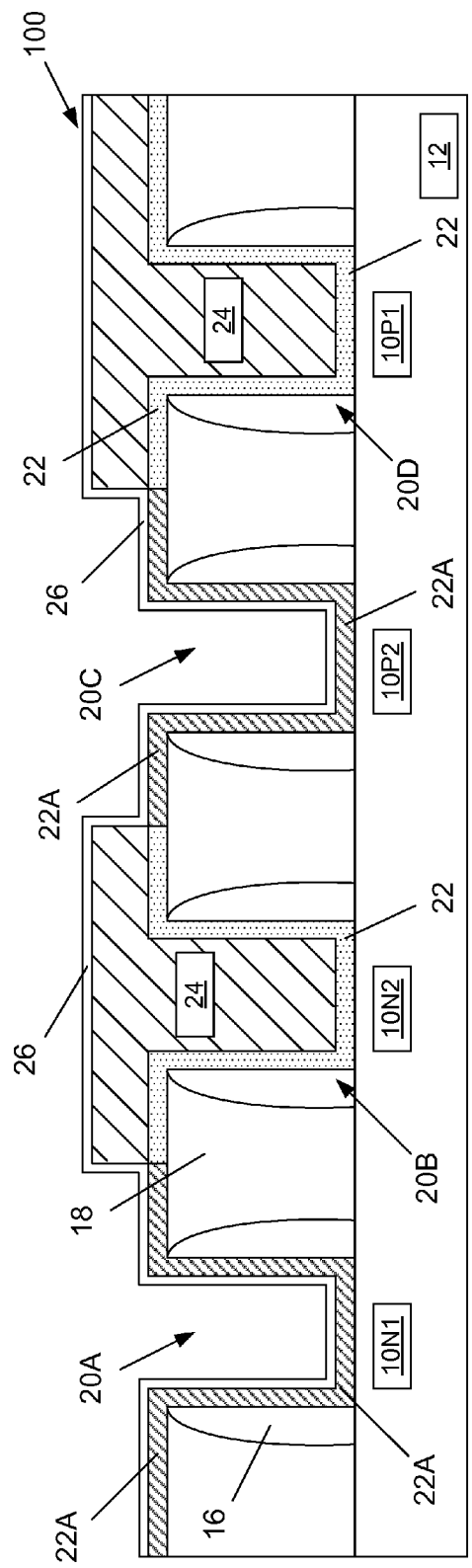

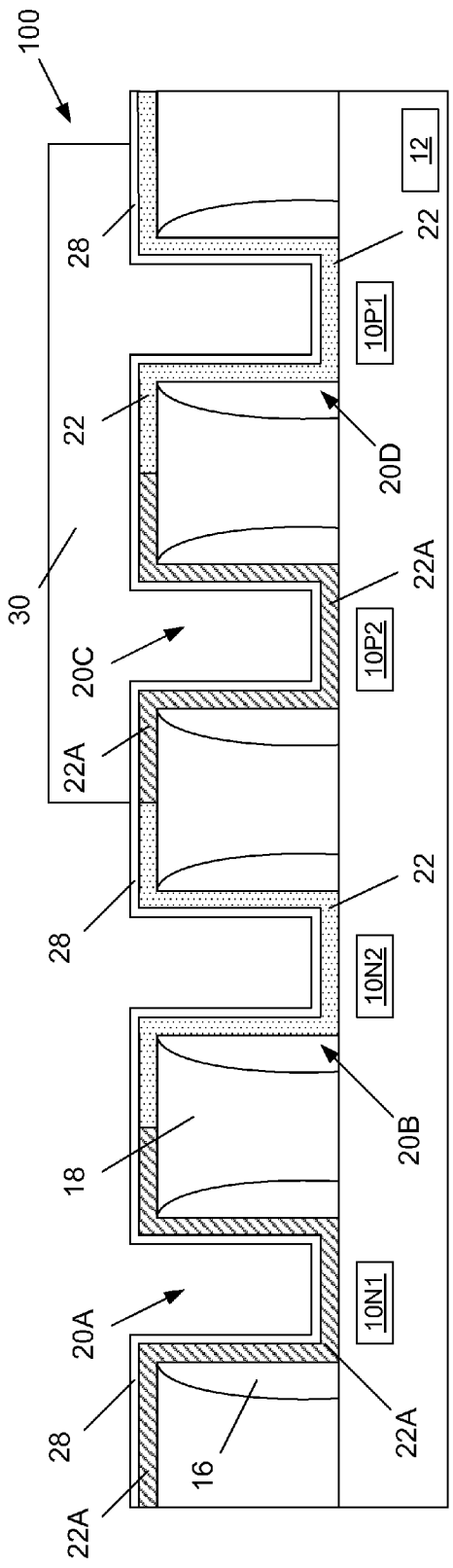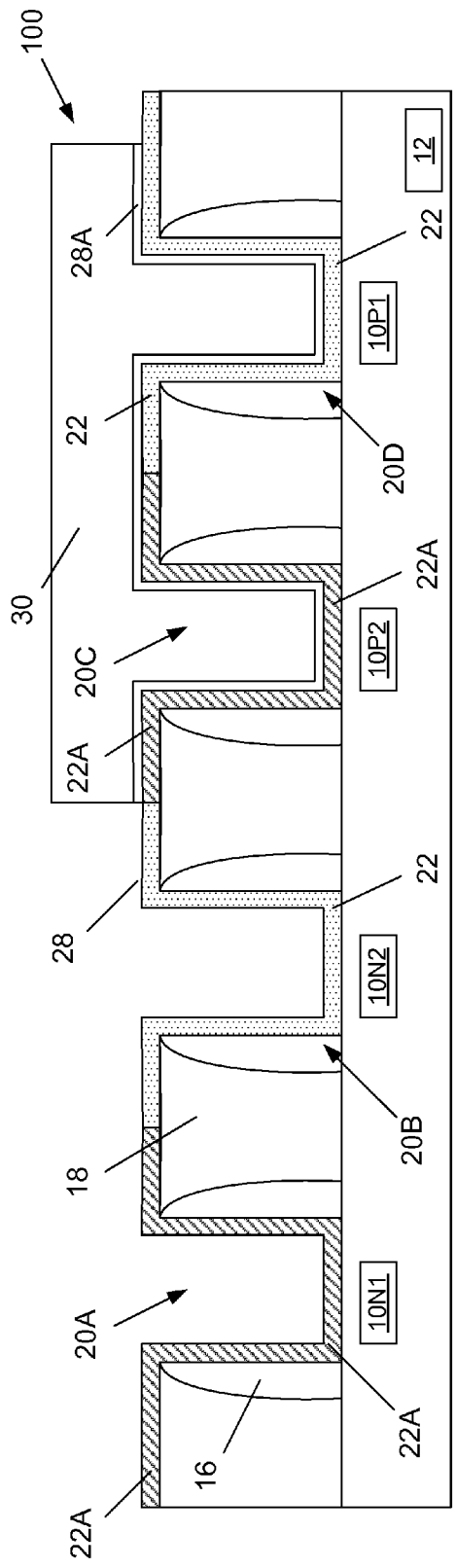

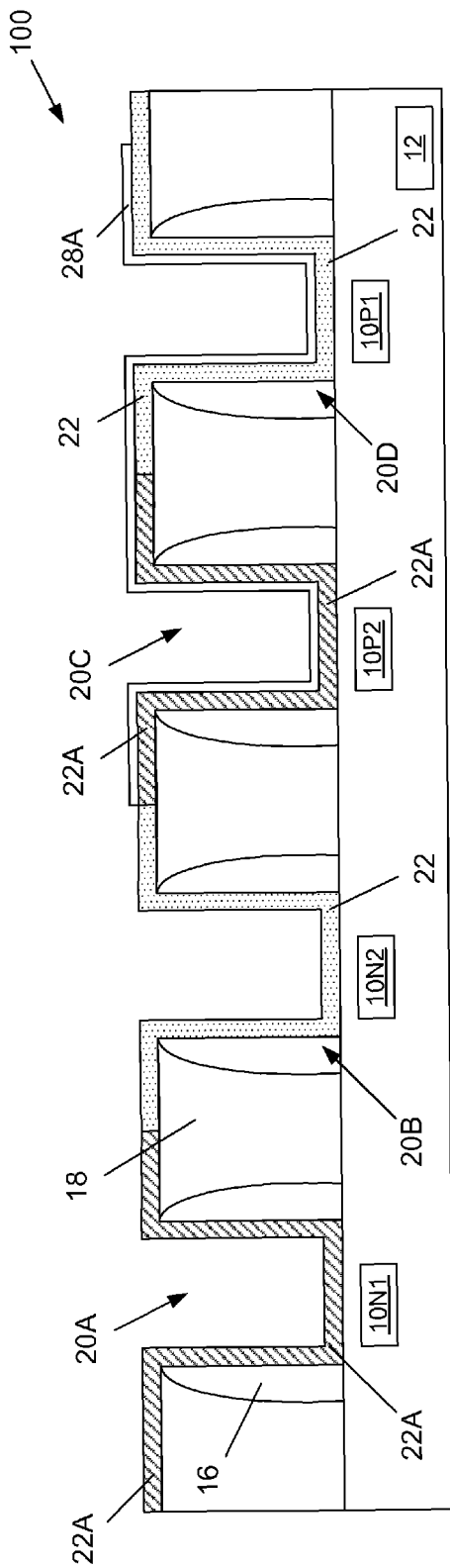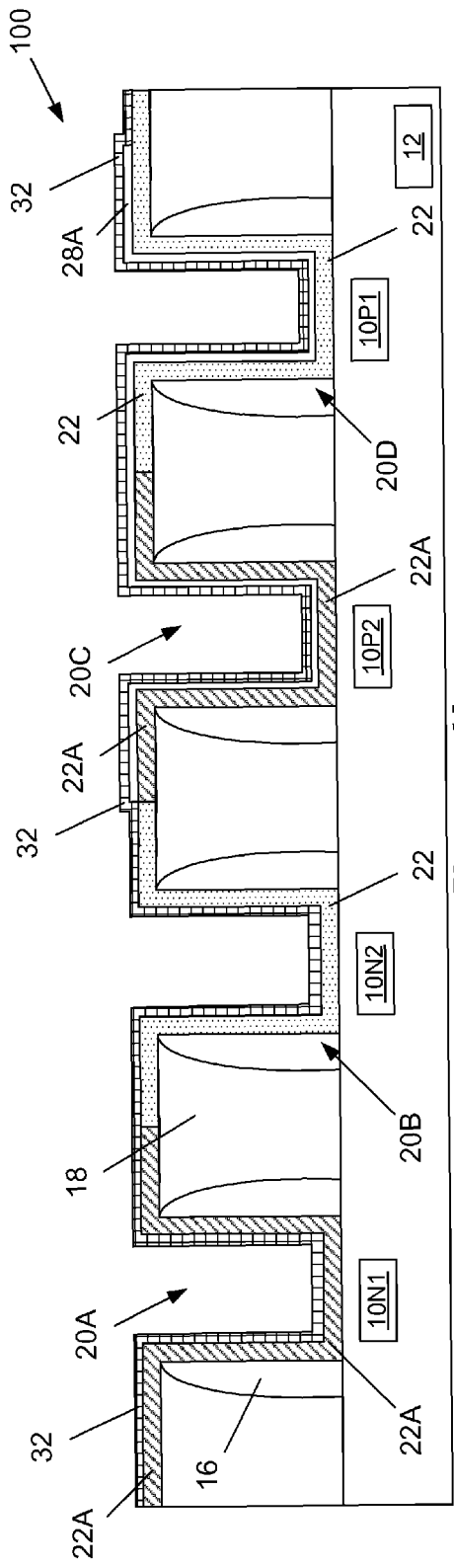

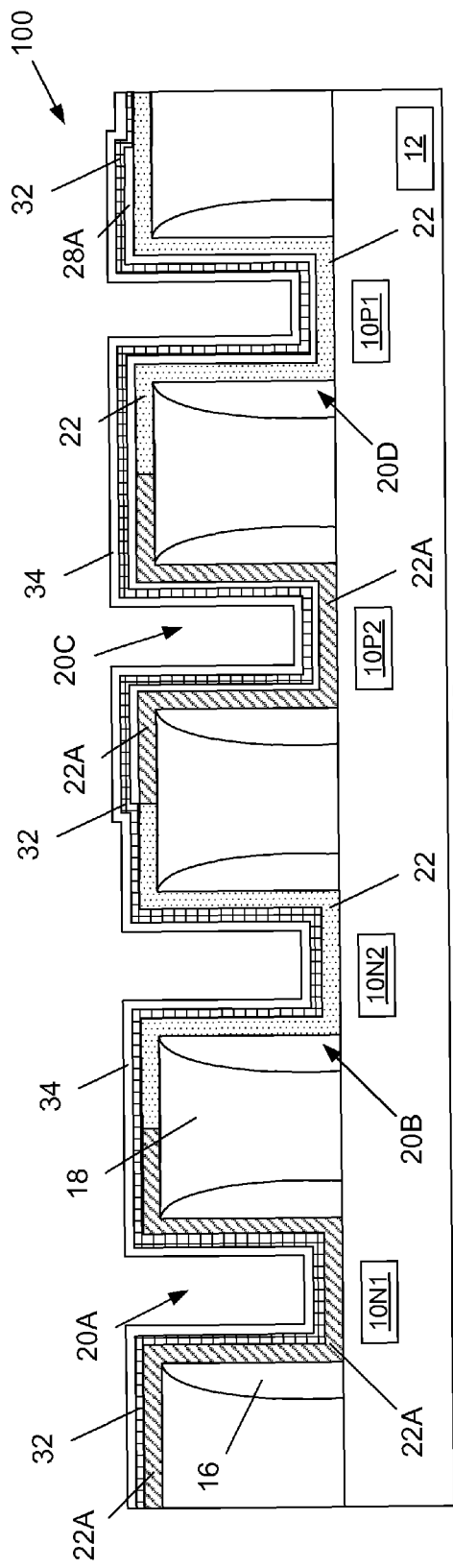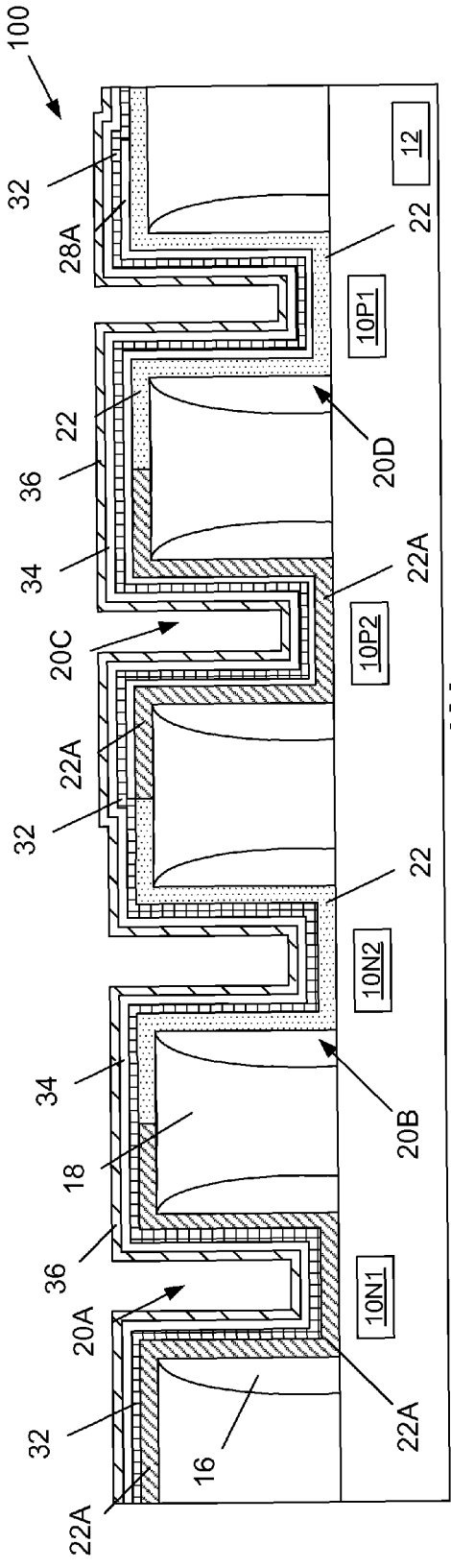

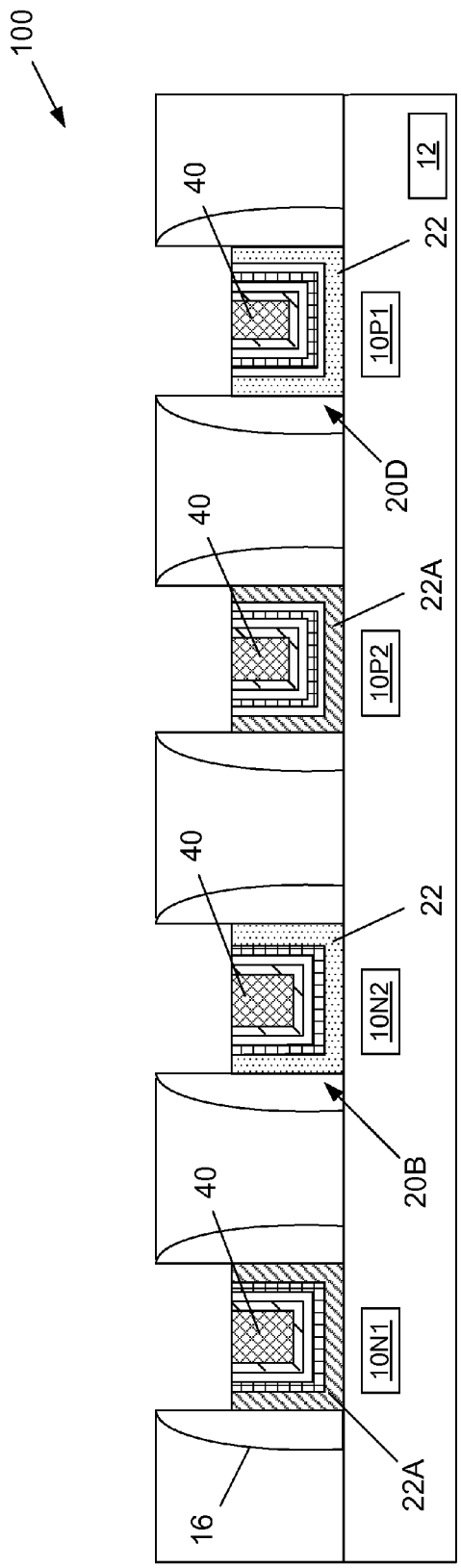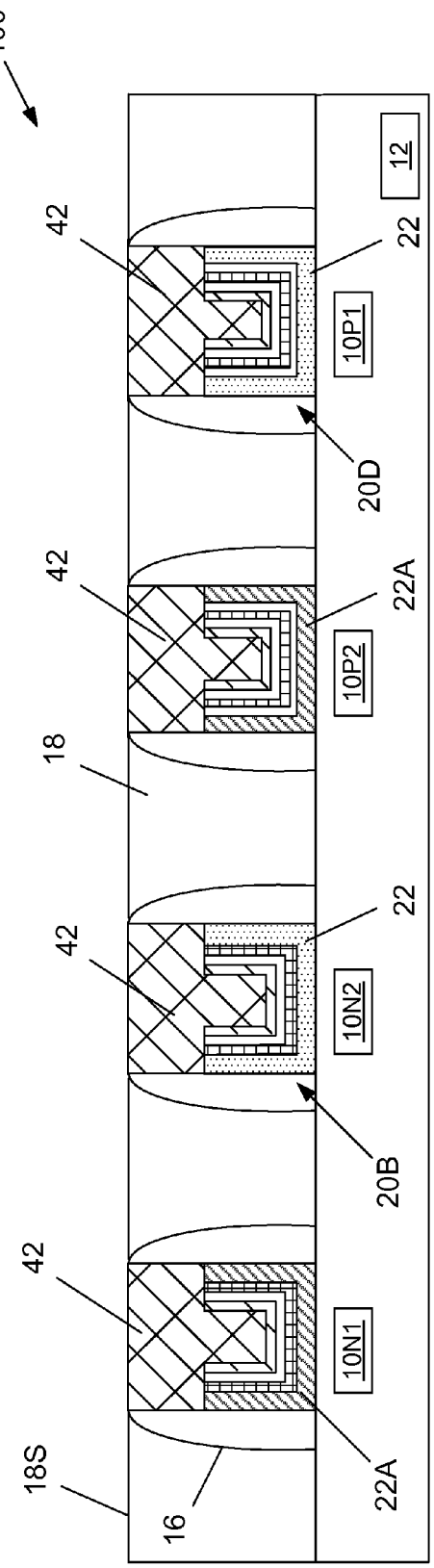

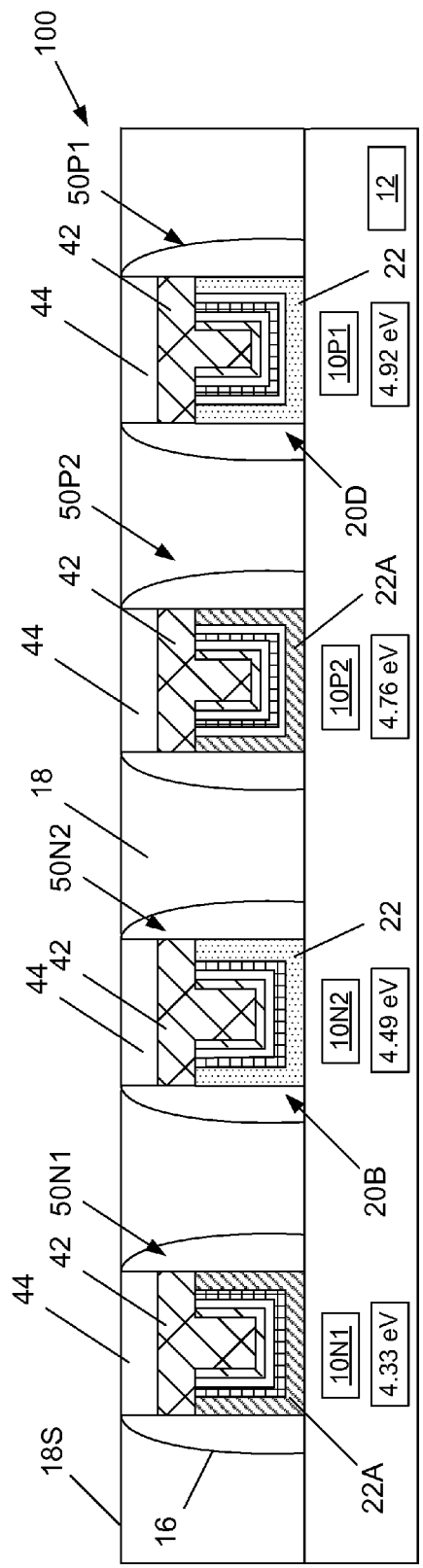
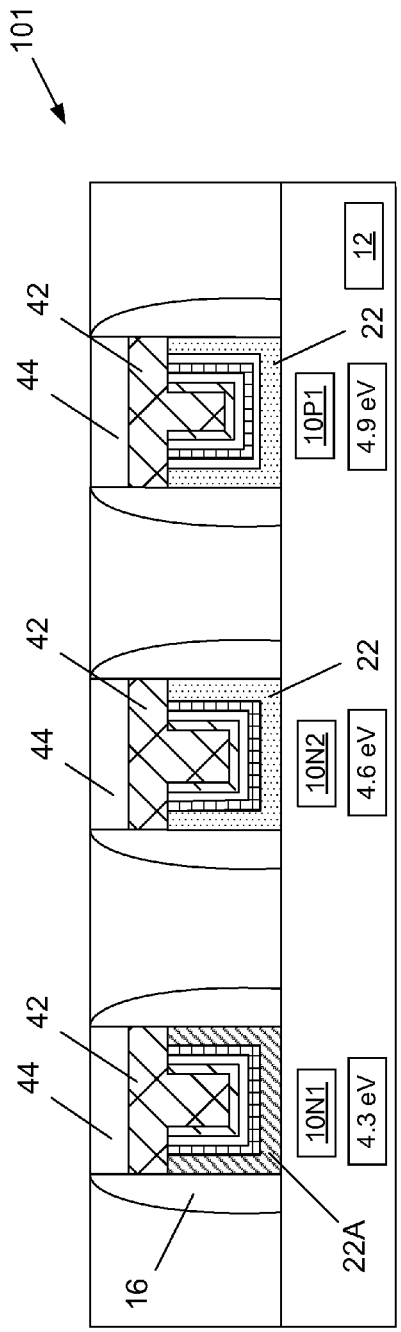
Figure 1T
Figure 1U

METHODS OF FORMING GATE STRUCTURES WITH MULTIPLE WORK FUNCTIONS AND THE RESULTING PRODUCTS

BACKGROUND OF THE INVENTION

1. Field of the Invention

Generally, the present disclosure relates to the manufacture of semiconductor devices, and, more specifically, to various novel methods of forming gate structures for transistors with multiple work function values and various integrated circuit products containing such transistors.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3D or FinFET devices.

For many decades, planar FET devices were the dominant choice for making integrated circuit products due to the relatively easier manufacturing methods that are used to form such planar devices as compared to the manufacturing methods involved in forming 3D devices. To improve the operating speed of planar FETs, and to increase the density of planar FETs on an integrated circuit device, device designers have greatly reduced the physical size of planar FETs over the years. More specifically, the channel length of planar FETs has been significantly decreased, which has resulted in improving the switching speed of planar FETs. However, decreasing the channel length of a planar FET also decreases the distance between the source region and the drain region. In some cases, this decrease in the separation between the source and the drain regions makes it difficult to efficiently inhibit the electrical potential of the source region and the channel from being adversely affected by the electrical potential of the drain region. This is sometimes referred to as so-called short channel effects, wherein the characteristic of the planar FET as an active switch is degraded.

As noted above, in contrast to a planar FET, a so-called 3D or FinFET device has a three-dimensional (3D) structure. More specifically, in a FinFET, a generally vertically positioned fin-shaped active area is formed in a semiconductor substrate and a gate structure (gate insulation layer plus the gate electrode) is positioned around both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin, become a conductive channel region thereby allowing current to flow. In a FinFET device, the "channel-width" is approximately two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of Fin-FET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements has been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

In manufacturing modern integrated circuit products, transistor devices are sometimes intentionally formed so as to exhibit different threshold voltage levels. In general, a transistor having a relatively lower threshold voltage will operate at a higher switching speed than that of a corresponding transistor with a relatively higher threshold voltage level. Such "low-$V_t$" (LVT) transistor devices are typically employed in portions of an integrated circuit product where device performance or speed is desirable or critical, e.g., in the logic circuits of an integrated circuit product. Unfortunately, such low-$V_t$ devices tend to exhibit more off-state leakage currents, which means that they consume more power than would otherwise be desired. Thus, all other things being equal, such low-$V_t$ devices are poor choices in applications where reduced power consumption is important, e.g., mobile computing applications, cell phone applications, etc. The opposite is true for so-called "high-$V_t$" (HVT) transistor devices—they tend to operate at slower switching speeds (a negative) but the off-state leakage currents of such high-$V_t$ devices is less than that of the low-$V_t$ devices (a positive). Such high-$V_t$ devices are typically employed in portions of an integrated circuit product where device performance or speed is less critical, e.g., SRAM circuits. Device designers can also make so-called "regular-$V_t$" (RVT) transistor devices that have a threshold voltage level that is intermediate to that of the low-$V_t$ devices and the high-$V_t$ devices. Of course, the absolute value of these threshold voltage levels (low, regular and high) may vary depending upon a variety of factors.

Device designers have employed several techniques to intentionally change the threshold voltage levels of transistor devices. One technique simply involves changing the gate length—the distance between the source region and the drain region—of the transistor. All other things being equal, a transistor with a shorter gate length will operate at faster speeds, but it will exhibit higher off-state leakage currents than a corresponding transistor having a larger channel length. Device dimensions have decreased to the point where gate lengths are so small that manufacturing devices with ever smaller gate lengths is very challenging, time-consuming and expensive. Thus, adjusting threshold voltage levels by continuing to reduce the channel length of the transistor devices is becoming more problematic.

Another technique that device designers have used to vary the threshold voltage of transistors involved varying the amount of dopant material used in forming the wells in which the transistors were formed. All other things being equal, the greater the dopant concentration in a well region, the greater will be the threshold voltage of the resulting transistor, and vice-versa. However, in some applications, such as forming FinFET devices, it is very challenging to get the appropriate doping levels, due to random dopant fluctuations and the normal Gaussian distribution of ion implantation processes in general.

Yet another technique that device designers have used to form transistor devices with differing threshold voltage levels simply involves making gate stacks of different materials having different work function values so as to ultimately achieve the desired variation in the threshold voltage levels of the devices. The term "work function" (WF) is commonly used in the art of semiconductor design and manufacturing to refer to the minimum energy needed to remove an electron from the surface of a metal. The work function of a metal is typically a constant characteristic of that metal material and it is usually measured in electron-volts (eV). In general, in CMOS integration schemes using a silicon substrate, a work function metal having a work function near the conduction band edge of silicon (about 4.0 eV) is necessary for NMOS type devices, while a different work function metal having a work function near the valance band edge of silicon (about 5.1-5.2 eV) is necessary for PMOS devices. Thus, in CMOS integration schemes employing high-k gate dielectric materials, at least two types of gate stacks are needed, i.e., a stack of suitable materials that satisfies the individual work function requirements for the PMOS devices and a different stack of materials that satisfies the individual work function requirements for the NMOS devices. As noted above, the gate stack for the PMOS devices provides a flat band voltage closer to the valence band edge of the material of the channel of the PMOS devices, and the gate stack for the NMOS devices provides a flat band voltage closer to the conduction band edge of the material of the channel of the NMOS devices.

By way of example, forming CMOS-based integrated circuit products with dual work function transistor devices might involve depositing a layer of high-k material, e.g., hafnium oxide, that will serve as the gate insulation layer for all of the transistor devices (both PMOS and NMOS) and then depositing a P-work function metal, such as titanium nitride (WF=about 4.9 eV), on the high-k gate insulation layer. Thereafter, the P-work function metal would be patterned so that it is only present on the PMOS devices. Then, an N-work function metal, e.g., an aluminum-based material, such as titanium-aluminum (WF=about 4.3 eV), is deposited above the exposed high-k insulation material (where the NMOS devices will be formed) and above the patterned P-work function metal. After patterning the N-work function metal, the gate stack of the PMOS device is comprised of three layers of material (the high-k gate insulation material, the P-work function metal and the N-work function metal), whereas the gate stack of the NMOS device is comprised of only two layers of material (the high-k gate insulation material and the N-work function metal).

The above-mentioned layer stacking process can be expanded to achieve transistor devices having additional work function levels by simply using the appropriate masking, metal deposition and metal etching steps. For example, to produce an integrated circuit product with transistor devices having three different work function values, the regions of the substrate where the third device will be formed could have been etched so as to clear the gate insulation layer of the P- and N-work function metals described above. Thereafter, a third metal layer, such as tungsten nitride (WF=about 4.6—intermediate that of the P- and N-work function metals) could be deposited above the exposed high-k insulation material (where the third device will be formed) and above the patterned P-work function metal and the patterned N-work function metal. After patterning the third metal layer, the gate stack of the PMOS device is comprised of four layers of material (the high-k gate insulation material, the P-work function metal, the N-work function metal and the third metal layer), the gate stack of the NMOS device is comprised of three layers of material (the high-k gate insulation material, the N-work function metal and the third metal layer) and the gate stack of the third device is comprised of only two layers of material (the high-k gate insulation material and the third metal layer). This process can be applied to obtain four different work functions. In addition to the N- and P-work function metal, one can employ sub-N-work function metals (WF=4.45 eV) and sub-P-work function (WF=4.75 eV) metals. The process explained above can be repeated to integrate a third and a fourth device that has a gate structure including such third and fourth metal layers.

As is readily apparent, the above-mentioned layer stacking process can become quite unwieldy and complex as more and more version of transistor devices with different threshold voltage levels are fabricated. Among other problems, etching of metals tends to be more difficult and the different physical heights of the gate stacks of the various devices can cause problems during subsequent processing operations. As an example, it may be more difficult to achieve a truly planar surface on a layer of material that is deposited above all of the different height gate stacks even if the layer is subjected to one or more chemical mechanical polishing processes. Such a lack of planarity can lead to problems in accurately patterning the deposited layer of material due to depth-of-focus variations when it comes to exposing a layer of photoresist material positioned above the deposited layer.

The present disclosure is directed to novel methods of forming gate structure transistors with multiple work function values and various integrated circuit products containing such transistors that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to novel methods of forming gate structures for transistors with multiple work function values and various integrated circuit products containing such transistors. One illustrative method disclosed herein includes, among other things, performing at least one etching process to remove a sacrificial gate structure for an NMOS transistor and a sacrificial gate structure for a PMOS transistor to thereby define an NMOS gate cavity and a PMOS gate cavity, forming a high-k gate insulation layer in the NMOS gate cavity and in the PMOS gate cavity, forming a lanthanide-based material layer on the high-k gate insulation layer that is positioned within the NMOS and PMOS gate cavities, performing at least one heating process to drive material from the lanthanide-based material layer into the high-k gate insulation layer so as to thereby form a lanthanide-containing high-k gate insulation layer in each of the NMOS and PMOS gate cavities, and performing at least one process operation to form a first gate electrode structure above the lanthanide-containing high-k gate insulation layer in the NMOS gate cavity and a second gate electrode structure above the lanthanide-containing high-k gate insulation layer in the PMOS gate cavity.

Another illustrative method disclosed herein includes, among other things, performing at least one etching process to remove a sacrificial gate structure for an NMOS transistor and a sacrificial gate structure for a PMOS transistor to thereby define an NMOS gate cavity and a PMOS gate cavity, forming a high-k gate insulation layer comprised of hafnium oxide in the NMOS gate cavity and in the PMOS gate cavity, forming a layer of lanthanum oxide on the high-k gate insulation layer that is positioned within the NMOS and PMOS gate cavities, performing at least one heating process to drive lanthanum from the layer of lanthanum oxide into the high-k gate insulation layer so as to thereby form a hafnium-lanthanum oxide gate insulation layer in each of the NMOS and PMOS gate cavities, and performing at least one process operation to form a first gate electrode structure on the hafnium-lanthanum oxide gate insulation layer in the NMOS gate cavity and a second gate electrode structure on the hafnium-lanthanum oxide gate insulation layer in the PMOS gate cavity.

Yet another illustrative method disclosed herein includes, among other things, performing at least one etching process to remove a sacrificial gate structure for a first NMOS transistor and a sacrificial gate structure for each of a first and a second PMOS transistor to thereby define an NMOS gate cavity and first and second PMOS gate cavities, forming a high-k gate insulation layer in each of the NMOS gate cavity and within the first and second PMOS gate cavities, forming a patterned hard mask layer that covers the high-k gate insulation layer within the first PMOS gate cavity while leaving the high-k gate insulation layer within the NMOS gate cavity and within the second PMOS gate cavity exposed, forming a lanthanide-based material layer on the exposed high-k gate insulation layer in the NMOS gate cavity, on the exposed high-k gate insulation layer in the second PMOS gate cavity and above the patterned hard mask layer, performing at least one heating process to drive material from the lanthanide-based material layer into the high-k gate insulation layer in the NMOS gate cavity and into the high-k gate insulation layer in the second PMOS gate cavity so as to thereby form a first lanthanide-containing high-k gate insulation layer in the NMOS gate cavity and a second lanthanide-containing high-k gate insulation layer in the second PMOS gate cavity, performing at least one etching process to remove the lanthanide-based material layer and the patterned hard mask layer, and performing at least one process operation to form a first gate electrode structure on the first lanthanide-containing high-k gate insulation layer in the NMOS gate cavity, a second gate electrode structure on the second lanthanide-containing gate high-k insulation layer in the second PMOS gate cavity and a third gate electrode structure on the high-k gate insulation layer in the first PMOS gate cavity.

One example of a novel integrated circuit product disclosed herein includes, among other things, an NMOS transistor having a gate structure comprised of an NMOS gate insulation layer comprised of lanthanide-containing high-k insulation material and an NMOS work function adjusting metal layer positioned above the NMOS gate insulation layer and a PMOS transistor having a gate structure comprised of a PMOS gate insulation layer comprised of the lanthanide-containing high-k gate insulation material and a PMOS work function adjusting metal layer positioned above the PMOS gate insulation material.

Yet another novel device disclosed herein includes, among other things, a first NMOS transistor having a gate structure comprised of a first NMOS gate insulation layer comprised of lanthanide-containing high-k insulation material and a first NMOS work function adjusting metal layer positioned above the first NMOS gate insulation layer. The device also includes a second NMOS transistor having a gate structure comprised of a second NMOS gate insulation layer comprised of a high-k insulation material and a second NMOS work function adjusting metal layer positioned above the second NMOS gate insulation layer, wherein the first and second NMOS work function adjusting metal layers are comprised of the NMOS work function adjusting material. The device further includes a first PMOS transistor having a gate structure comprised of a first PMOS gate insulation layer comprised of the high-k insulation material and a first PMOS work function adjusting metal layer positioned above the first PMOS gate insulation layer. The device also includes a second PMOS transistor having a gate structure comprised of a second PMOS gate insulation layer comprised of the lanthanide-containing high-k insulation material and a second PMOS work function adjusting metal layer positioned above the second PMOS gate insulation layer, wherein the first and second PMOS work function adjusting metal layers are comprised of the same PMOS work function adjusting material.

BRIEF DESCRIPTION OF THE DRAWINGS

The disclosure may be understood by reference to the following description taken in conjunction with the accompanying drawings, in which like reference numerals identify like elements, and in which.

Figure 1G:
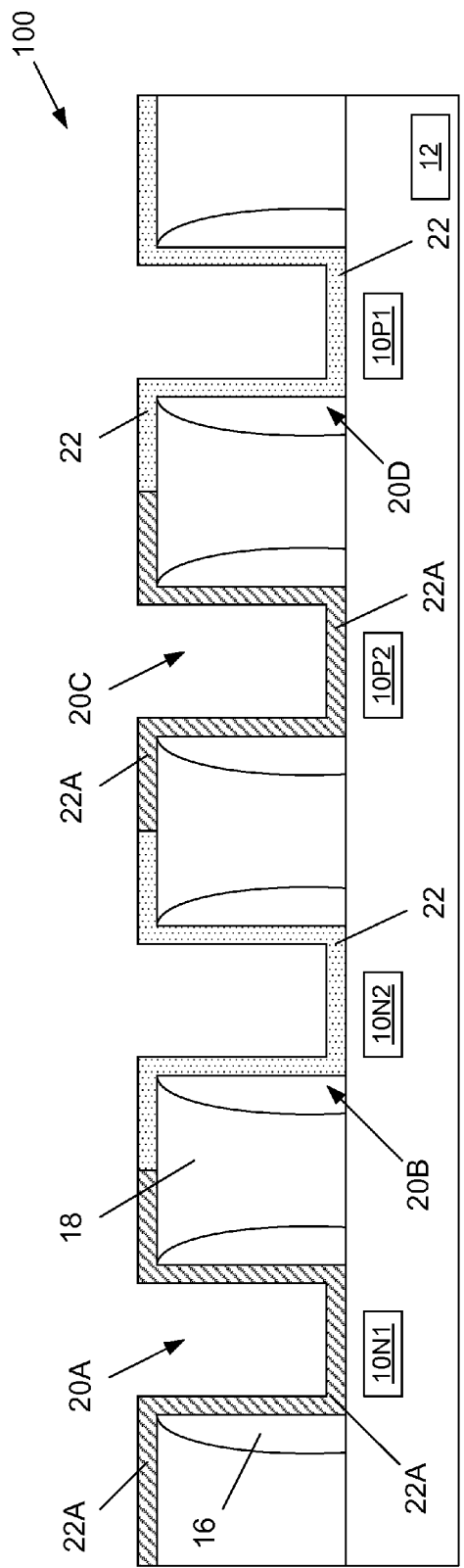
FIGS. 1A-1W depict various illustrative methods disclosed herein for forming gate structures for CMOS-based integrated circuit products and various novel CMOS-based integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to novel methods of forming gate structures for transistors with multiple work function values and various integrated circuit products containing such transistors. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FinFETs, or a combination of such devices. For purposes of disclosure, reference will be made to an illustrative process flow wherein an integrated circuit product 100 is formed with a plurality of FinFET transistor devices using CMOS technology. Moreover, the inventions will be disclosed in the context of forming the gate structures using a replacement gate processing technique. However, the methods, structures and products disclosed herein may be employed where the gate structures of the transistors are formed using so-called gate-first processing techniques. Thus, the inventions disclosed herein should not be considered to be limited to the illustrative examples depicted and described herein.

FIG. 1A is a simplified, cross-sectional view of an illustrative integrated circuit product 100 at an early stage of manufacturing. A plurality of transistor devices, 10N1, 10N2, 10P1 and 10P2 will be formed above a semiconductor substrate 12 using a so-called replacement gate technique. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials. The cross-sectional view depicted in the attached figures is taken through the long axis of an illustrative fin 13 that is formed from the substrate 12. Stated another way, the cross-sectional views depicted in the attached drawings are taken through the gate structures of the various transistors in a direction that corresponds to the gate length direction of the transistors. So as not to obscure the inventions disclosed herein, isolation regions that are formed in the substrate 12 to define active regions where the transistor devices, 10N1, 10N2, 10P1 and 10P2 will be formed are not depicted in the attached drawings. Additionally, various doped regions, e.g., source/drain regions, halo implant regions, well regions and the like, are also not depicted in the attached drawings.

As noted above, in one illustrative embodiment, four illustrative transistor devices, 10N1, 10N2, 10P1 and 10P2 will be formed above the substrate 12. In this example, each of the transistor devices, 10N1, 10N2, 10P1 and 10P2 will be formed so as to have a different work function value. In the depicted example, the transistor devices 10N1 and 10N2 are NMOS devices, while the transistors 10P1 and 10P2 are PMOS devices. The NMOS transistor device 10N1 will be formed so as to exhibit a lower work function value than the NMOS transistor device 10N2. The PMOS transistor device 10P1 will be formed so as to exhibit a higher work function value than the PMOS transistor device 10P2. Thus, for example, the illustrative NMOS transistor device 10N1 and PMOS transistor device 10P1 may be employed in applications where higher performance, e.g., higher switching speeds, is an important design consideration, e.g. N-logic circuits and P-logic circuits, respectively. In contrast, the illustrative NMOS transistor device 10N2 and PMOS transistor device 10P2 may be employed in applications where reduced power consumption, e.g., lower off-state leakage currents, is an important design consideration, e.g., N-based SRAM circuits and P-based SRAM circuits, respectively. By using the methods and devices disclosed herein, device designers will have greater flexibility in designing integrated circuit products 100 that are more tailored to meet the intended application.

With continuing reference to FIG. 1A, the product 100 is depicted at a point in fabrication wherein sacrificial gate structures 14 have been formed above the substrate 12 and any gate cap layers (not shown) that were previously positioned above the sacrificial gate structures 14 have been removed. At this point in the replacement gate process flow, source/drain regions (not shown) would have already been formed in the substrate 12 and an anneal process would have been performed to activate the implanted dopant materials and repair any damage to the substrate 12 due to the various ion implantation processes that were performed. The sacrificial gate structures 14 include a sacrificial gate insulation layer 14A and a dummy or sacrificial gate electrode 14B. Also depicted are illustrative sidewall spacers 16 and a layer of insulating material 18. The various components and structures of the product 100 may be formed using a variety of different materials and by performing a variety of known techniques. For example, the sacrificial gate insulation layer 14A may be comprised of silicon dioxide, the sacrificial gate electrode 14B may be comprised of polysilicon, the sidewall spacers 16 may be comprised of silicon nitride and the layer of insulating material 18 may be comprised of silicon dioxide. The layers of material depicted in FIG. 1A, as well as the layers of material described below, may be formed by any of a variety of different known techniques, e.g., a chemical vapor deposition (CVD) process, an atomic layer deposition (ALD) process, physical vapor deposition (PVD), a thermal growth process, etc.

As shown in FIG. 1B, one or more etching processes are performed to remove the sacrificial gate electrodes 14B and the sacrificial gate insulation layers 14A to thereby define a plurality of gate cavities 20A-D where a different replacement gate structure will subsequently be formed for each of the transistor devices, 10N1, 10N2, 10P1 and 10P2, respectively. Typically, the sacrificial gate insulation layers 14B are removed as part of the replacement gate technique, as depicted herein. However, the sacrificial gate insulation layers 14B may not be removed in all applications. Even in cases where the sacrificial gate insulation layer 14B is intentionally removed, there will typically be a very thin native oxide layer (not shown) that forms on the substrate 12 within the gate cavities 20A-D.

FIG. 1C depicts the product 100 after several process operations were performed. First, a pre-clean process was performed in an attempt to remove all foreign materials from within the gate cavities 20A-D prior to forming the various layers of material that will become part of the replacement gate structures. Thereafter, a high-k (k value greater than 10) gate insulation layer 22, such as hafnium oxide, having a thickness of approximately 1-3 nm was initially deposited in the gate cavities 20A-D by performing an ALD process.

FIG. 1D depicts the product 100 after several process operations were performed so as to ultimately form a patterned sacrificial hard mask 24 above the high-k gate insulation layer 22 in each of the gate cavities 20B and 20D, while leaving the high-k gate insulation layer 22 within the gate cavities 20A and 20C exposed. The sacrificial hard mask 24 may be comprised of a variety of different materials, e.g., polysilicon, a metal, etc. In one illustrative embodiment, the sacrificial hard mask 24 may be comprised of a layer of titanium nitride and it may be formed to any desired thickness. The patterned sacrificial hard mask 24 may be formed by blanket-depositing (via PVD or CVD) a hard mask material layer on the product 100 so as to over-fill all of the gate cavities 20A-D, forming a patterned photoresist etch mask (not shown) above the deposited hard mask material layer, and thereafter performing an etching process to remove the desired portions of the deposited hard mask material layer so as to thereby result in the depicted patterned sacrificial hard mask 24. The high-k gate insulation layer 22 may serve as an etch stop during the patterning of the hard mask material layer. Thereafter, the patterned photoresist etch mask may be removed so as to arrive at the structure depicted in FIG. 1D.

FIG. 1E depicts the product after a lanthanide-based material layer 26 has been formed on the exposed portions of the high-k gate insulation layer 22 and on the patterned sacrificial hard mask 24. The lanthanide-based material layer 26 may be in the form of a metal, an oxide, a carbide, a halide or a nitride, its thickness may vary depending upon the particular application, and it may be formed using any desired process, e.g., ALD, PVD, CVD, etc. In one illustrative embodiment, the lanthanide-based material layer 26 is a layer of lanthanum oxide that has a thickness of about 1 nm that was formed by performing an ALD process. As described more fully below, the thickness of the lanthanide-based material layer 26 may be varied to change the magnitude of the band-gap phase shift in the affected transistor devices. In general, use of a relatively thicker lanthanide-based material layer 26 will result in a relatively greater magnitude in the band-gap phase shift of the affected devices. Additionally, a larger thermal budget induces more diffusion from the lanthanide-based material layer 26, which creates a larger shift in the device.

With reference to FIG. 1F, an anneal process has been performed to drive-in or intermix some of the lanthanide-based material layer 26 with the portions of the high-k gate insulation layer 22 that it contacts. This process results in forming a plurality of lanthanide-containing high-k insulating material layers 22A, i.e., intermixed layers 22A that are an intermixture or alloy of the high-k insulation material and portions of the lanthanide-based material layer 26. For example, in the case where the high-k gate insulation layer 22 is comprised of hafnium oxide and the lanthanide-based material layer 26 is comprised of lanthanum oxide, the intermixed layers 22A may be comprised of hafnium-lanthanum oxide ($HfLa_xO_y$). In the depicted example, the anneal process is performed for such a duration that the entire thickness of the original high-k gate insulation layer 22 is intermixed with the lanthanum-based materials from the lanthanide-based material layer 26. In one example, the drive-in anneal process may be performed at a temperature that falls within the range of about 500-1200° C. for a duration of a few nanoseconds up to about 1-10 seconds. The type of anneal process that is performed may vary depending upon the particular application, e.g., a spike anneal, a laser anneal, an RTA process, etc. In some embodiments, the drive-in anneal process described above may be performed as part of or in addition to a so-called reliability anneal process that is typically performed to increase the reliability of the high-k gate insulation layer 22. Additionally, although not depicted in the attached drawings, in some applications, additional layers of material may be formed above the lanthanide-based material layer 26 prior to performing the drive-in anneal process described above. For example, a layer of titanium nitride (not shown) with a thickness of about 1-2 nm may be formed on the lanthanide-based material layer 26. Thereafter, a layer of polysilicon or amorphous silicon (not shown) may be blanket-deposited on the layer of titanium nitride so as to over-fill the gate cavities 20A and 20C. At that point, the above-described drive-in anneal process may then be performed as part of or in addition to the traditional reliability anneal process that is performed on the high-k gate insulation layer 22.

FIG. 1G depicts the product 100 after one or more etching processes have been performed to remove all materials except the remaining portions of the high-k gate insulation layer 22 (in the gate cavities 20B and 20D) and the intermixed layers 22A (in the gate cavities 20A and 20C). For example, in the case where the above-described titanium nitride layer and layer of polysilicon/amorphous silicon materials were formed, the etching sequence might be as follows: a DHF-based etch process followed by an $NH_4OH$-based wet process to remove the surface oxide layer and the underlying polysilicon/amorphous silicon sequentially; an SC1-based etch process to remove the layer of titanium nitride; an SC2-based etch process to remove the lanthanum oxide; and another SC-1 based etch process to remove the patterned sacrificial hard mask 24 (when it is made of titanium nitride).

Figure 1H:
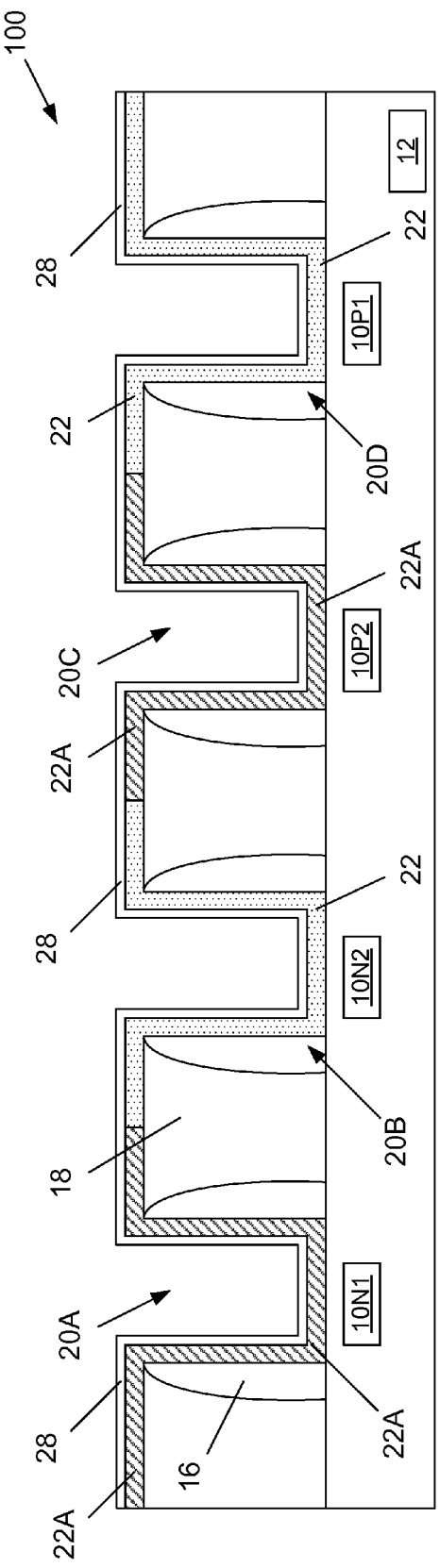
Figure 10:
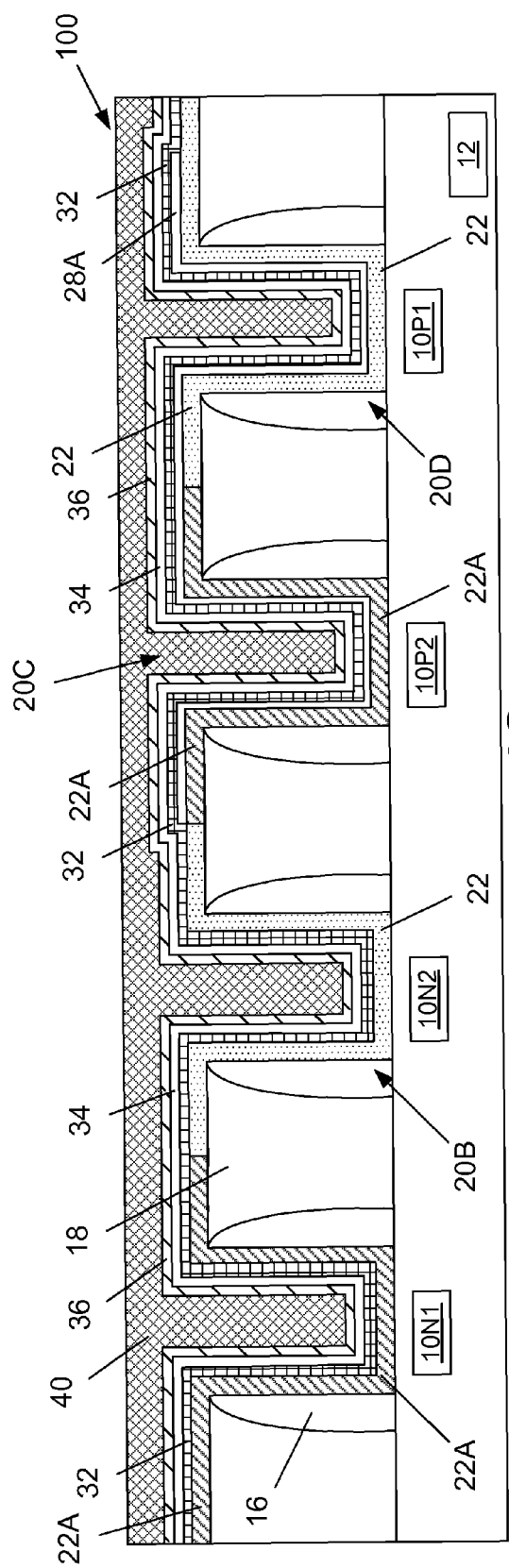

Next, as shown in FIG. 1H, a first metal layer 28 is formed on the high-k gate insulation layer 22 and intermixed layers 22A within the gate cavities 20A-D. The first metal layer 28 is comprised of a metal that will serve as the work function adjusting metal for the PMOS transistors 10P1 and 10P2, i.e., the layer 28 is a P-work function metal. The thickness of the first metal layer 28 may vary depending upon the particular application, and it may be formed using any desired process, e.g., ALD, PVD, etc. In one example, the first metal layer 28 may be a layer of titanium nitride, TaN, WN, TiC, TaC, etc., it may have a thickness of about 2-7 nm, and it may be formed by performing an ALD process or a plasma-enhanced physical vapor deposition (PVD) process.

FIG. 1I depicts the product 100 after a patterned masking layer 30 is formed above the product 100. The patterned masking layer 30 covers the PMOS regions, i.e., PMOS transistors 10P1 and 10P2, while leaving the NMOS regions, i.e., NMOS transistors 10N1 and 10N2, exposed for further processing. In one embodiment, the patterned masking layer 30 may be a patterned layer(s) of photoresist material(s) that may be formed using known photolithography tools and techniques.

FIG. 1J depicts the product 100 after a dry or wet etching process was performed to remove the exposed portions of first metal layer 28. More specifically, the first metal layer 28 (the P-work function metal) was removed from the gate cavities 20A and 20B of NMOS transistors 10N1 and 10N2, respectively. As a result of this etching process, the remaining portions of the first metal layer 28A are positioned only in the gate cavities 20C and 20D for the PMOS transistors 10P2 and 10P1, respectively.

FIG. 1K depicts the product 100 after the patterned mask layer 30 was removed. The mask layer 30 may be removed by performing a variety of known processes, e.g., ashing.

Next, as shown in FIG. 1L, an optional second metal layer 32 was formed on the product 100. The second metal layer 32 is comprised of a metal that will serve as a barrier layer to prevent diffusion of the N-work function metal into the underlying gate insulation layers. However, in some cases, the N-work function metal may be deposited directly on the gate insulation layers. In one example, the second metal layer 32 may be a layer of titanium nitride, TaN, TiSiN, TaSiN, WN, or WSiN, it may have a thickness of about 0.5-2 nm, and it may be formed by performing an ALD process.

Next, as shown in FIG. 1M, a third metal layer 34 was formed on the second metal layer 32. The third metal layer 34 is comprised of a metal that will function as the work function adjusting metal for the NMOS devices. In one example, the third metal layer 34 may be a layer of titanium aluminum carbon (TiAlC), TiAl, TiAlN, TaAl, TaAlC, HfAlC, HfAl, WSi, TiSi, HfSi or any other N-type work function metal, it may have a thickness of about 1-8 nm, and it may be formed by performing an ALD process. The above-described barrier layer 32 is typically needed when the N-work function metal contains aluminum.

Next, as shown in FIG. 1N, a fourth metal layer 36 was formed on the third metal layer 34. The fourth metal layer 36 is comprised of a metal that will function as an adhesion layer for conductive materials like W, Al, Ti, Co and their alloys, and it will also serve as a protection layer to prevent oxidation of the N-work function layer. However, the fourth metal layer 36 may not be required in all applications. For example, if the conductive material that is yet to be formed exhibits good adhesion properties with respect to the N-work function metal, then the fourth metal layer 36 may be omitted in those applications. In one example, the fourth metal layer 36 may be a layer of titanium nitride, TaN, TiSiN, TaSiN, WN or WSiN, it may have a thickness of about 1-6 nm, and it may be formed by performing an ALD or a CVD process.

FIG. 1O depicts the product 100 after a sacrificial layer 40 was blanket-deposited on the product 100 so as to over-fill the gate cavities 20A-D. The sacrificial layer 40 may be comprised of a variety of different materials, e.g., OPL, etc., and it may be formed by performing, for example, a spin-coating process. The sacrificial layer 40 may be formed to any desired thickness. If desired, a CMP process may be performed on the sacrificial layer 40.

Figure 1P:
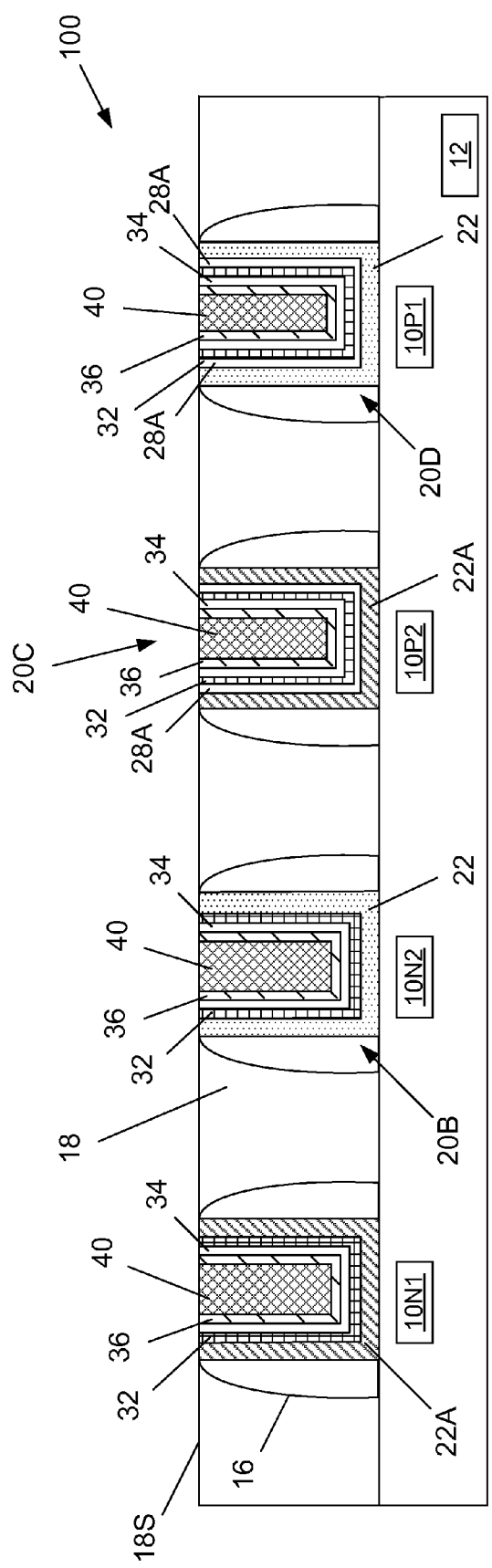

FIG. 1P depicts the product 100 after one or more planarization processes, e.g., CMP processes, were performed to remove the portions of the various layers of material described above that were positioned above the surface 18S of the layer of insulating material 18 and outside of the gate cavities 20A-D.

Figure 1Q:
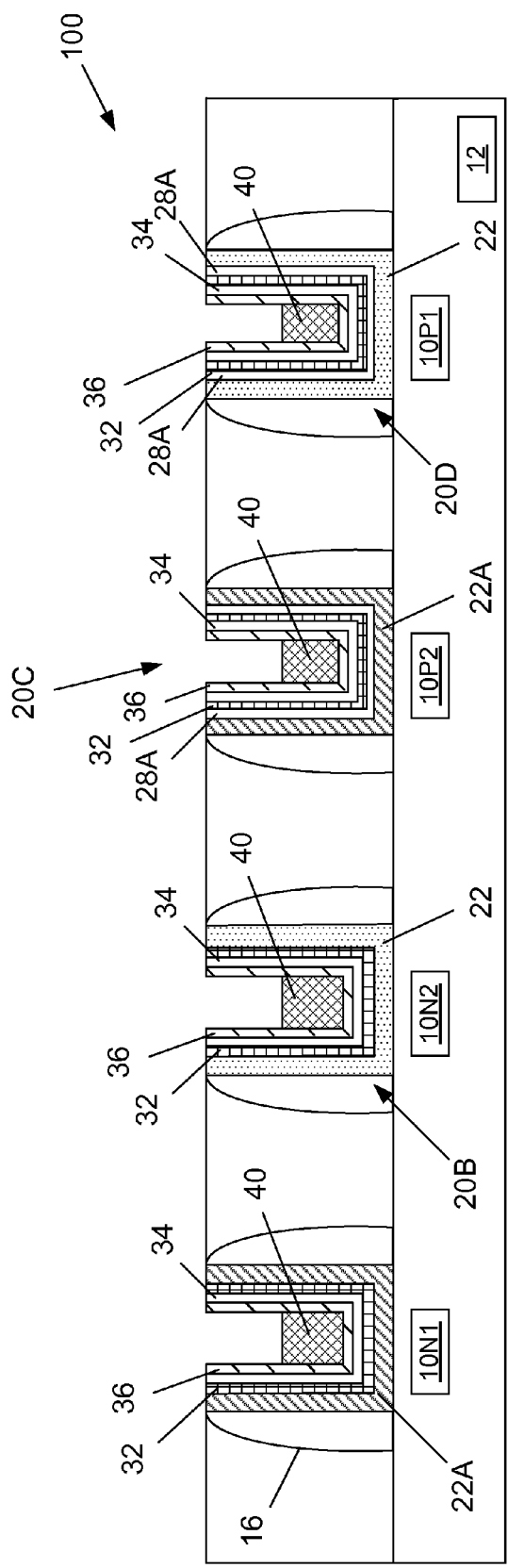

Next, as shown in FIG. 1Q, a dry or wet etching process was performed to recess the sacrificial layer 40 within the gate cavities 20A-D. In one embodiment, the recessing process may be a timed etching process and the remaining portions of the sacrificial material layer 40 positioned within the gate cavities 20A-20D may have a thickness (in the vertical direction) that falls within the range of about 50-90 nm, in the case where the total gate height may be about 100 nm (e.g., from the top of a fin).

FIG. 1R depicts the product 100 after one or more timed etching processes, e.g., timed dry or wet etching processes, were performed to remove portions of the layers 22A, 22, 28A, 32, 34 and 36 positioned within the gate cavities 20A-D.

FIG. 1S depicts the product after several process operations were performed. First an etching or solvent-based process operation was performed to remove the remaining portions of the sacrificial material layer 40 from within the gate cavities 20A-20D. Then, a conductive material layer 42 was blanket-deposited on the product 100 so as to over-fill the gate cavities 20A-D. The conductive material layer 42 may be comprised of a variety of different conductive materials, e.g., a metal such as W, Al, Co, Ti, Ni, any alloys that include such metals, a metal silicide, highly-doped polysilicon, etc., and it may be formed by performing, for example, a CVD, ALD or PVD process, while perhaps including a reflow step. In some cases, an adhesion or wetting layer may need to be formed prior to forming the conductive material layer due to poor nucleation or poor adhesion on spacer dielectric, e.g., CVD W needs ALD TiN as wetting and adhesion layer. The conductive material layer 42 may be formed to any desired thickness. Next, one or more planarization processes, e.g., CMP processes, were performed to remove the portions of the conductive material layer 42 positioned above the surface 18S of the layer of insulating material 18 and outside of the gate cavities 20A-D.

FIG. 1T depicts the product 100 after several process operations were performed. First, a dry or wet etching process was performed to recess the conductive material layer 42 within the gate cavities 20A-D. In one embodiment, the recessing process may be a timed etching process and the remaining portions of the sacrificial material layer 42 positioned within the gate cavities 20A-20D may be recessed so as to have any desired thickness. Next, a gate cap layer 44 was formed in each of the gate cavities 20A-D. The gate cap layers 44 may be comprised of, for example, silicon nitride, and they may be formed by blanket-depositing a layer of gate cap material (not shown) so as to over-fill the gate cavities 20A-D and thereafter performing one or more planarization processes, e.g., CMP processes, to remove the portions of the gate cap material layer positioned above the surface 18S of the layer of insulating material 18 and outside of the gate cavities 20A-D. At this point in the process flow, the final gate structures 50N1, 50N2, 50P1 and 50P2 have been formed for the transistor devices 10N1, 10N2, 10P1 and 10P2, respectively. At the point of fabrication depicted in FIG. 1T, the integrated circuit product 100 may be completed by performing several traditional manufacturing processes, e.g., the formation of contacts to the source/drain regions of the device, the formation of various metallization layers for the product, etc.

Using the methods disclosed herein, the transistor devices 10N1, 10N2, 10P1 and 10P2 may be formed with different gate structures and they may be formed so as to have four different work function values. Accordingly, the transistor devices 10N1, 10N2, 10P1 and 10P2 of the product 100 will have different threshold voltage levels. More specifically, in the depicted example, the methods disclosed herein result in a phase shift in band gap voltage of about minus 0.16 eV for the devices 10N1 (4.33 eV) and 10P2 (4.76 eV) that include the lanthanide-containing gate insulating layers 22A as compared to the corresponding devices 10N2 (4.49 eV) and 10P1 (4.92 eV), respectively, that have the traditional high-k gate insulating material 22 as the gate insulation layer. In this particular example, the lanthanide-based material layer 26 was a layer of lanthanum oxide that was formed to a thickness of about 0.1-1 nm. Importantly, and surprisingly, the use of the lanthanide-containing gate insulating layers 22A provides an effective means to control the work function of the PMOS devices as well as the NMOS devices. Providing device designers with techniques to manufacture multiple-$V_t$ devices gives designers increased flexibility as it relates to designing ever more complex and sophisticated integrated circuit products. The table below sets forth some aspects of the novel structure 100 depicted in FIG. 1T.

| TRANSISTOR | GATE STRUCTURE | WF VALUE |
|---|---|---|
| 10N1 | 22A - Intermixed high-k gate insulation - 1.7 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.33 |
| 10N2 | 22 - Original high-k gate insulation - 1.7 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.49 |
| 10P2 | 22A - Intermixed high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.76 |
| 10P1 | 22 - Original high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.92 |

In addition to the four-device example depicted above in FIG. 1T, the methods disclosed herein may be employed to form an integrated circuit product with a lesser number of transistor devices exhibiting differing work function values. More specifically, FIG. 1U depicts an embodiment of another integrated circuit product 101 that includes three illustrative transistor devices 10N1, 10N2 and 10P1 that may be formed with different gate structures so as to have three different work function values and different threshold voltage levels. In the depicted example, the methods disclosed herein result in a phase shift in work function of about minus 0.3 eV for the device 10N1 (4.3 eV) that includes the lanthanide-containing gate insulating layer 22A as compared to the corresponding device 10N2 (4.6 eV) that has a traditional high-k gate insulating material 22 and a midgap work function metal. In this example, the device 10P1 (4.9 eV) is formed with a traditional high-k gate insulation layer 22. Thus, the device 10N2 may be thought of as a "mid-gap" device. It should be noted that the mid-gap device could have equally been made as a PMOS device that employed the lanthanide-containing gate insulating layer 22A disclosed herein, i.e., an opposite case of the above-mentioned embodiment where N-work function metal is used for 10N1, P-work function metal is used for 10N2 and 10P1 where $La_2O_3$ layer is incorporated into 10N2 to make the −0.3 eV shift from 4.9 eV. In this particular example, the lanthanide-based material layer 26 was a layer of lanthanum oxide that was formed to a thickness of about 0.1-1 nm (1-10 A), which accounts for the relatively higher band-gap voltage (−0.3 eV) shift for this embodiment as compared to the embodiment shown in FIG. 1T. The table below sets forth some aspects of the novel structure 101 depicted in FIG. 1U.

| TRANSISTOR | GATE STRUCTURE | WF VALUE |
|---|---|---|
| 10N1 | 22A - Intermixed high-k gate insulation - 1.7 nm;<br>32 - TiN or TiSiN - barrier - 1 nm;<br>34 - WN or WSi (Midgap) - 5 nm (N-WFM);<br>36 - TiN - adhesion - 1 nm; and<br>42 - Tungsten | 4.3 |
| 10N2 | 22 - Original high-k gate insulation - 1.7 nm; | 4.6 |

-continued

| TRANSISTOR | GATE STRUCTURE | WF VALUE |
|---|---|---|
| | 32 - TiN or TiSiN - barrier - 1 nm;<br>34 - WN or WSi (Midgap) - 5 nm (N-WFM);<br>36 - TiN - adhesion - 1 nm; and<br>42 - Tungsten | |
| 10P1 | 22 - Original high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.9 |

Figure 1V:
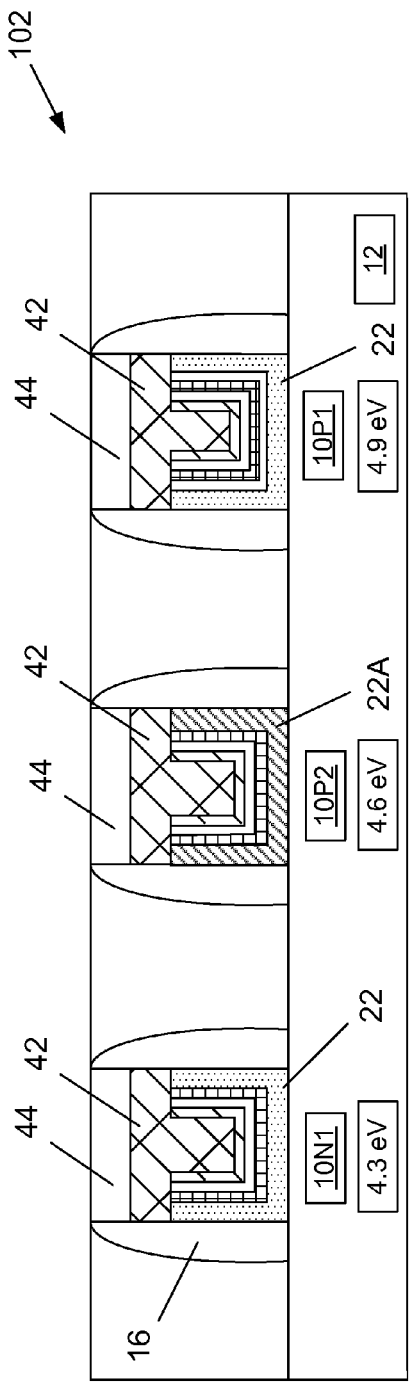

FIG. 1V depicts an embodiment of another integrated circuit product 102 that includes three illustrative transistor devices 10N1, 10P1 and 10P2 that may be formed with different gate structures so as to have three different work function values and different threshold voltage levels. More specifically, in the depicted example, the methods disclosed herein result in a phase shift in work function of about minus 0.3 eV for the device 10P2 (4.6 eV) that includes the lanthanide-containing gate insulating layer 22A as compared to the corresponding device 10P1 (4.9 eV) that is formed with a traditional high-k gate insulation layer 22. In this embodiment, the device 10N1 (4.3 eV) is also formed with the traditional high-k gate insulation layer 22. The table below sets forth some aspects of the novel structure 101 depicted in FIG. 1V.

| TRANSISTOR | GATE STRUCTURE | WF VALUE |
|---|---|---|
| 10N1 | 22 - Original high-k gate insulation - 1.7 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.3 |
| 10P2 | 22A - Intermixed high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.6 |
| 10P1 | 22 - Original high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.9 |

Figure 1W:
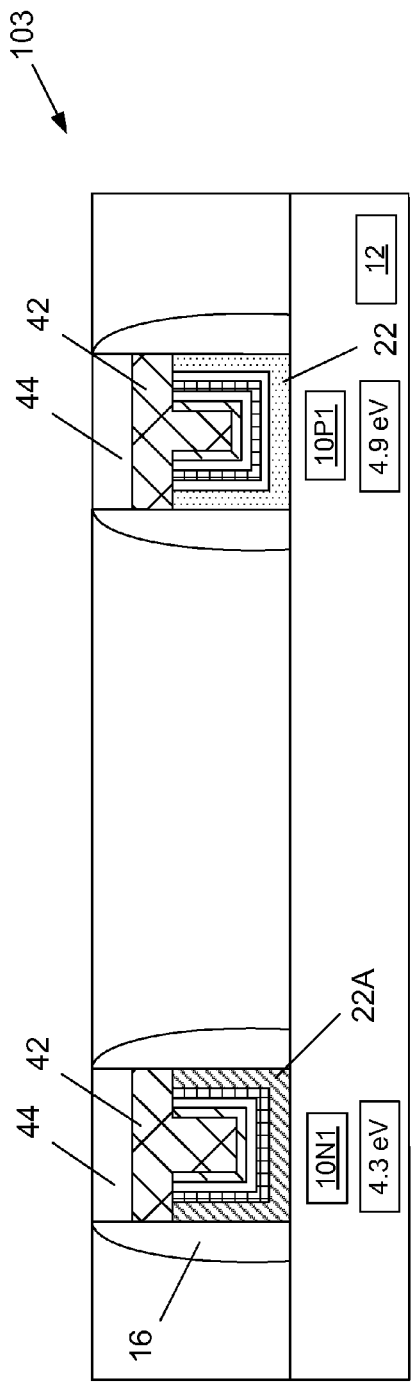

FIG. 1W depicts an embodiment of another integrated circuit product 103 that includes two illustrative transistor devices 10N1 and 10P1 that may be formed with different gate structures so as to have two different work function values and different threshold voltage levels. More specifically, in the depicted example, the methods disclosed herein result in a phase shift in band gap voltage of about minus 0.6 eV for the device 10N1 (4.3 eV) that include the lanthanide-containing gate insulating layer 22A as compared to the device 10P1 (4.9 eV) that is formed with a traditional high-k gate insulation layer 22. In this particular example, the lanthanide-based material layer 26 was a layer of lanthanum oxide that was formed to a thickness of about 0.5-2 nm, which accounts for the relatively higher band-gap voltage shift for this embodiment (−0.6 eV) as compared to the other embodiments shown in FIGS. 1S-1T above. The table below sets forth some aspects of the novel structure 103 depicted in FIG. 1W.

| TRANSISTOR | GATE STRUCTURE | WF VALUE |
|---|---|---|
| 10N1 | 22A - Intermixed high-k gate insulation - 1.7 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.3 |
| 10P1 | 22 - Original high-k gate insulation - 1.7 nm;<br>28A - TiN - P - WFN - 4 nm;<br>32 - TiN or TiSiN - barrier - 1 nm;<br>34 - TiAlC - 5 nm (N-WFM);<br>36 - TiN - adhesion - 1 nm; and<br>42 - Tungsten | 4.9 |

Importantly, the methodologies disclosed herein are equally compatible with forming replacement gate structures for NMOS and PMOS devices, as shown above. Thus, the methods disclosed here have significant value as it relates to forming integrated circuit products using CMOS technology. Other benefits will be apparent to those skilled in the art after a complete reading of the present application. At the point of fabrication depicted in FIGS. 1T-1W, the integrated circuit products 100-103 may be completed by performing several traditional manufacturing processes, e.g., the formation of contacts to the source/drain regions of the device, the formation of various metallization layers for the product, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method of forming replacement gate structures for an NMOS transistor and a PMOS transistor, comprising:
 performing at least one etching process to remove a sacrificial gate structure for said NMOS transistor and a sacrificial gate structure for said PMOS transistor to thereby define an NMOS gate cavity and a PMOS gate cavity;
 depositing a high-k gate insulation layer in said NMOS gate cavity and in said PMOS gate cavity;
 prior to performing any heating processes on said as-deposited high-k gate insulation layer in either of said NMOS or PMOS gate cavities, performing a deposition process to deposit a lanthanide-based material layer on said as-deposited high-k gate insulation layer that is positioned within said NMOS and PMOS gate cavities, wherein said as-deposited lanthanide-based material layer comprises lanthanum;

after depositing said lanthanide-based material layer, performing at least one heating process to drive material from said as-deposited lanthanide-based material layer into said as-deposited high-k gate insulation layer so as to thereby form a lanthanide-containing high-k gate insulation layer in each of said NMOS and PMOS gate cavities; and performing at least one process operation to form a first gate electrode structure above said lanthanide-containing high-k gate insulation layer in said NMOS gate cavity and a second gate electrode structure above said lanthanide-containing high-k gate insulation layer in said PMOS gate cavity.

2. The method of claim 1, wherein, said lanthanide-based material layer is comprised of one of a metal, an oxide, a halide, a carbide or a nitride.

3. The method of claim 1, wherein performing said at least one heating process comprises performing said at least one heating process at a temperatures that falls within the range of 500-1200° C. for a duration of 3 seconds or less.

4. The method of claim 1, wherein said lanthanide-based material layer is a layer of lanthanum oxide and said high-k gate insulation layer is a layer of hafnium oxide.

5. The method of claim 1, wherein said lanthanide-containing high-k gate insulation layer is a layer of hafnium-lanthanum oxide ($HfLa_xO_y$).

6. A method of forming replacement gate structures for an NMOS transistor and a PMOS transistor, comprising:

performing at least one etching process to remove a sacrificial gate structure for said NMOS transistor and a sacrificial gate structure for said PMOS transistor to thereby define an NMOS gate cavity and a PMOS gate cavity;

depositing a high-k gate insulation layer comprised of hafnium oxide in said NMOS gate cavity and in said PMOS gate cavity;

prior to performing any heating processes on said as-deposited high-k gate insulation layer in either of said NMOS or PMOS gate cavities, performing a deposition process to deposit a layer of lanthanum oxide on said as-deposited high-k gate insulation layer that is positioned within said NMOS and PMOS gate cavities;

performing at least one heating process to drive lanthanum from said layer of as-deposited lanthanum oxide into said as-deposited high-k gate insulation layer so as to thereby form a hafnium-lanthanum oxide gate insulation layer in each of said NMOS and PMOS gate cavities; and performing at least one process operation to form a first gate electrode structure on said hafnium-lanthanum oxide gate insulation layer in said NMOS gate cavity and a second gate electrode structure on said hafnium-lanthanum oxide gate insulation layer in said PMOS gate cavity.

7. The method of claim 6, wherein performing said at least one heating process comprises performing said at least one heating process at a temperatures that falls within the range of 500-1200° C. for a duration of 3 seconds or less.

8. A method of forming replacement gate structures for an NMOS transistor device and first and second PMOS transistor devices, comprising:

performing at least one etching process to remove a sacrificial gate structure for said first NMOS transistor and a sacrificial gate structure for each of said first and second PMOS transistors to thereby define an NMOS gate cavity and first and second PMOS gate cavities;

forming a high-k gate insulation layer in each of said NMOS gate cavity and within said first and second PMOS gate cavities;

forming a patterned hard mask layer that covers said high-k gate insulation layer within said first PMOS gate cavity while leaving said high-k gate insulation layer within said NMOS gate cavity and within said second PMOS gate cavity exposed;

forming a lanthanide-based material layer on said exposed high-k gate insulation layer in said NMOS gate cavity, on said exposed high-k gate insulation layer in said second PMOS gate cavity and above said patterned hard mask layer;

performing at least one heating process to drive material from said lanthanide-based material layer into said high-k gate insulation layer in said NMOS gate cavity and into said high-k gate insulation layer in said second PMOS gate cavity so as to thereby form a first lanthanide-containing high-k gate insulation layer in said NMOS gate cavity and a second lanthanide-containing high-k gate insulation layer in said second PMOS gate cavity;

performing at least one etching process to remove said lanthanide-based material layer and said patterned hard mask layer; and performing at least one process operation to form:
a first gate electrode structure on said first lanthanide-containing high-k gate insulation layer in said NMOS gate cavity;
a second gate electrode structure on said second lanthanide-containing gate high-k insulation layer in said second PMOS gate cavity; and
a third gate electrode structure on said high-k gate insulation layer in said first PMOS gate cavity.

9. The method of claim 8, wherein, said lanthanide-based material layer is comprised of one of a metal, an oxide, a halide, a carbide or a nitride.

10. The method of claim 8, wherein performing said at least one heating process comprises performing said at least one heating process at a temperatures that falls within the range of 500-1200° C. for a duration of 3 seconds or less.

11. The method of claim 8, wherein said lanthanide-based material layer is a layer of lanthanum oxide and said high-k gate insulation layer is a layer of hafnium oxide.

12. The method of claim 11, wherein said lanthanide-containing high-k gate insulation layer is a layer of hafnium-lanthanum oxide ($HfLa_xO_y$).

13. A method of forming replacement gate structures for a plurality of NMOS transistors and a plurality of PMOS transistors, the method comprising:

performing at least one etching process to remove a sacrificial gate structure for each of said pluralities of NMOS and PMOS transistors to thereby define respective pluralities of NMOS and PMOS gate cavities;

forming a high-k gate insulation layer in each of said pluralities of NMOS and PMOS gate cavities;

forming a lanthanide-based material layer on said high-k gate insulation layer that is positioned within a first NMOS gate cavity of said plurality of NMOS gate cavities and within a first PMOS gate cavity of said plurality of PMOS gate cavities while covering a second NMOS gate cavity of said plurality of NMOS gate cavities and a second PMOS gate cavity of said plurality of PMOS gate cavities;

performing at least one heating process to drive material from said lanthanide-based material layer into said high-k gate insulation layer formed in said first NMOS and PMOS gate cavities so as to thereby form a lanthanide-containing high-k gate insulation layer in each of said first NMOS and PMOS gate cavities; and performing at least one process operation to form a first gate electrode structure above said lanthanide-containing high-k gate insulation layer in said first NMOS gate cavity and above said high-k gate insulation layer in said second NMOS gate cavity, and to form a second gate electrode structure above said lanthanide-containing high-k gate insulation layer in said first PMOS gate cavity and above said high-k gate insulation layer in said second PMOS gate cavity.

14. The method of claim 13, wherein, said lanthanide-based material layer is comprised of one of a metal, an oxide, a halide, a carbide or a nitride.

15. The method of claim 13, wherein performing said at least one heating process comprises performing said at least one heating process at a temperatures that falls within the range of 500-1200° C. for a duration of 3 seconds or less.

16. The method of claim 13, wherein said lanthanide-based material layer is a layer of lanthanum oxide and said high-k gate insulation layer is a layer of hafnium oxide.

17. The method of claim 13, wherein said lanthanide-containing high-k gate insulation layer is a layer of hafnium-lanthanum oxide ($HfLa_xO_y$).

18. The method of claim 13, wherein covering said second NMOS and PMOS gate cavities comprises forming a sacrificial hard mask layer above said high-k gate insulation material layer in at least said second NMOS and PMOS gate cavities and forming said lanthanide-based material layer above said sacrificial hard mask layers formed in said second NMOS and PMOS gate cavities.

19. The method of claim 18, wherein forming said first and second gate electrode structures above said high-k gate insulation material layer in said respective NMOS and PMOS gate cavities comprises removing said lanthanide-based material layer from above each of said sacrificial hard mask layers and removing said sacrificial hard mask layers from said second NMOS and PMOS gate cavities.

* * * * *